US010114063B2

(12) United States Patent
Burek et al.

(10) Patent No.: US 10,114,063 B2
(45) Date of Patent: Oct. 30, 2018

(54) METHOD OF SINGLE-ENDED FAULT LOCATION IN HVDC TRANSMISSION LINES

(71) Applicant: ABB TECHNOLOGY AG, Zurich (CH)

(72) Inventors: Arkadiusz Burek, Wieliczka (PL); Tomasz Sikorski, Malcyzce (PL); Jacek Rezmer, Brzeg (PL)

(73) Assignee: ABB TECHNOLOGY AG, Zurich (CH)

( * ) Notice: Subject to any disclaimer, the term of this patent is extended or adjusted under 35 U.S.C. 154(b) by 275 days.

(21) Appl. No.: 15/030,116

(22) PCT Filed: Oct. 7, 2014

(86) PCT No.: PCT/EP2014/002722
§ 371 (c)(1),
(2) Date: Apr. 18, 2016

(87) PCT Pub. No.: WO2015/070942
PCT Pub. Date: May 21, 2015

(65) Prior Publication Data
US 2016/0266192 A1 Sep. 15, 2016

(30) Foreign Application Priority Data
Nov. 15, 2013 (EP) .................................. 13460075

(51) Int. Cl.
*G01R 31/08* (2006.01)
*G01R 31/11* (2006.01)
*H02H 7/26* (2006.01)

(52) U.S. Cl.
CPC ......... *G01R 31/085* (2013.01); *G01R 31/088* (2013.01); *G01R 31/11* (2013.01); *H02H 7/265* (2013.01)

(58) Field of Classification Search
CPC .................................................. G01R 31/085
USPC ........................................................ 702/59
See application file for complete search history.

(56) References Cited

U.S. PATENT DOCUMENTS 4,766,549 A   8/1988   Schweitzer, III et al. .... 364/481

FOREIGN PATENT DOCUMENTS

| CN | 101672883 A | 3/2010 | ............. G01R 31/08 |
| CN | 103364691 A | 10/2013 | ............. G01R 31/08 |
| WO | WO 2011/157967 A1 | 10/2011 | ............. G01R 31/08 |
| WO | WO 2013/071974 A1 | 5/2013 | ............... H02H 7/26 |

OTHER PUBLICATIONS

International Search Report in related application No. PCT/EP2014/002722 dated Dec. 1, 2014.
(Continued)

*Primary Examiner* — Anthony Ho
(74) *Attorney, Agent, or Firm* — Renner Kenner Greive Bobak Taylor & Weber

(57) ABSTRACT

The invention concerns a method of fault location in HVDC (High Voltage Direct Current) transmission lines, especially in mixed lines, where part of the line is overhead line and part is a cable line. The fault location is based on estimation arrival times of travelling waves induced by fault in transmission line that are propagating along the line from faulted point to the measurement point, which is located at one end of the transmission line.

6 Claims, 4 Drawing Sheets

(56) References Cited

OTHER PUBLICATIONS

Figure 1:
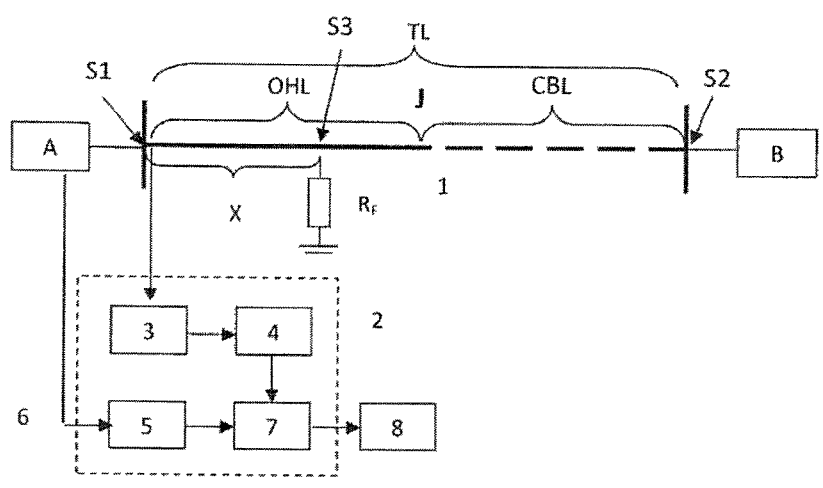

Written Opinion in related application No. PCT/EP2014/002722 dated Dec. 1, 2014.
Han Junyi et al.; *Fault location on mixed overhead line and cable transmission networks*; 2013 IEEE Grenoble Conference; IEEE Jun. 16, 2013; pp. 1-6.

METHOD OF SINGLE-ENDED FAULT LOCATION IN HVDC TRANSMISSION LINES

FIELD OF INVENTION

The invention concerns a method of fault location in transmission lines, a especially in HVDC (High Voltage Direct Current) mixed lines, where part of the line is overhead line and part is a cable line. The fault location is based on estimation arriving times of travelling waves induced by fault that are propagating along the line from faulted point to the measurement point, located at one end of the line.

BACKGROUND OF THE INVENTION

In transmission lines, different methods for fault detection and fault location may be used in order to locate accurately faulted place. For instance the most accurate solution in transmissions lines are utilizes the traveling wave principle—synchronized in time domain measurements from both ends of line. The computer device in a form of a fault locator monitors the traveling waves that are induced during appearing of faults. The waves are propagated from faulted place, with the velocity close to the speed of light in overhead lines, in both directions in transmission line. In the end of the transmission line the waves are detected and its times of arrival at the measuring points are determined.

From patent application WO2011127967A1 there is known a method and apparatus for determining the time of arrival of fault wave at a measurement point of power transmission system. The method is useful for localization a faulted place in transmission lines which is a homogeneous line. For long transmission mixed lines like overhead line and submarine cable or underground cable it is desirable to determine where such a fault occurs directly after the fault. The distance to the faulted place is proportional to the difference between times of arrival the first fault waves at measurement points in two stations and to the speed of the fault wave in transmission line. The distance to the fault can be determined with the accuracy of the synchronization device used for detection time of fault waves arriving. Usually the synchronization error is close to 200 ns. This invention is in general a double-ended method.

A single-ended transmission line fault locator is known from patent U.S. Pat. No. 4,766,549. A system for locating faults in a transmission line is presented. The system for locating faults in a high voltage direct current (HVDC) transmission lines uses measurements taken from only one end of the transmission line. The system comprises means for detecting transients, i.e. traveling waves, generated by a fault located in the transmission line and means for sorting by polarity detected transients for transients produced by a fault and transients reflected from the one end of the transmission line. Further the system comprises means for determination the arrival times of transients at one end of the transmission line and means for calculation the difference between the arrival times of such transients in order to determine the location of the fault. Such system is operating in a homogeneous type of transmission line—pure overhead line or pure cable line, but suffer some malfunctions when the transmission line is consisted from two or more different segments, overhead and cable segments, where each segment has different surge impedances and different wave propagation velocities, what causes additional wave reflections at junction point of such two segments. The present invention offers an improvement over the above discussed single-ended techniques.

The present invention is utilized a creation of a traveling waves schemes what is known for example from a literature "Transmission Lines and Wave Propagation", by Philip C. Magnusson, Gerald C. Alexander, Vijai K. Tripathi, Andreas Weisshaar; 4th Edition, 2001, CRC Press LLC [chapter 3] for calculation the traveling wave pulses in a theoretical faulted point and theoretical arrival times of such pulses to the measuring points with a use a Bewley lattice diagrams.

SUMMARY OF INVENTION

The essence of the invention consists on:
creation a reference database, comprising theoretical time schemes for at least first, second and third theoretical traveling wave pulses P1', P2', P3' generated in theoretical faulted points for known theoretical distances X1 established by user for known line parameters and calculation of times of arrival T1', T2', T3' of such pulses in the measuring point (S1), detection the presence of a faulted pulses in unknown real point of the line for an unknown distance through measuring traveling wave pulses P1, P2, P3 in one end of the faulted line and calculation of arrival times of first T1, second T2 and third T3 of traveling pulses P1, P2, P3 in a computer device for unknown distance for faulted line, where T1 is equal 0 when a magnitude of the first pulse P1 has a value bigger than a threshold Th given by the user, and creation a real time scheme for pulses P1, P2, P3 generated in faulted point, comparing a real time scheme of pulses P1, P2, P3 generated in faulted point with theoretical time scheme of pulses P1', P2', P3' generated in known theoretical faulted points and matching by polarity checking of real time scheme for unknown point with all theoretical time schemes, indication the known distance for theoretical time scheme, which is the best matching time scheme with the real time scheme for unknown distance, indication the unknown distance as a value equal to the known distance what determines the location of faulted point.

Preferably theoretical time scheme for first, second and third theoretical traveling wave pulses P1', P2', P3' generated in theoretical faulted points are based on Bewley lattice diagrams for such pulses and theoretical arrival times T1', T2', T3' calculated for theoretical known distances given by user, are taken for creation theoretical time schemes.

Preferably the process of matching real time scheme for unknown faulted point with theoretical time scheme is based on calculating a time difference $\Delta T2_k$ between the real arrival times T2 and theoretical arrival time T2' for second traveling wave pulses P2 and P2', and a time difference $\Delta T3_k$ between the real arrival times T3 and theoretical arrival time T3' for third traveling wave pulses P3 and P3'.

Preferably a sum of absolute values of time differences $\Delta T2_k$ and $\Delta T3_k$ is calculated for selection of a minimum value of a sum $\Sigma(k)$.

Preferably the unknown distance X of faulted point is determined by selection of a minimum value of an absolute sum of time differences.

Preferably after the determination the unknown distance of faulted point an alarm is triggering for faulted line and accurate value of fault location is known.

The advantage of the invention is an improvement over the prior art and allows for increasing an accuracy of a fault location in transmission lines, especially lines comprise many different segments having different surge impedance. The invention enables the fault location without using communication channel or GPS (Global Positioning System) like device between two terminals, because the only one end measurement is applied.

EMBODIMENT OF THE INVENTION

Figure 2:
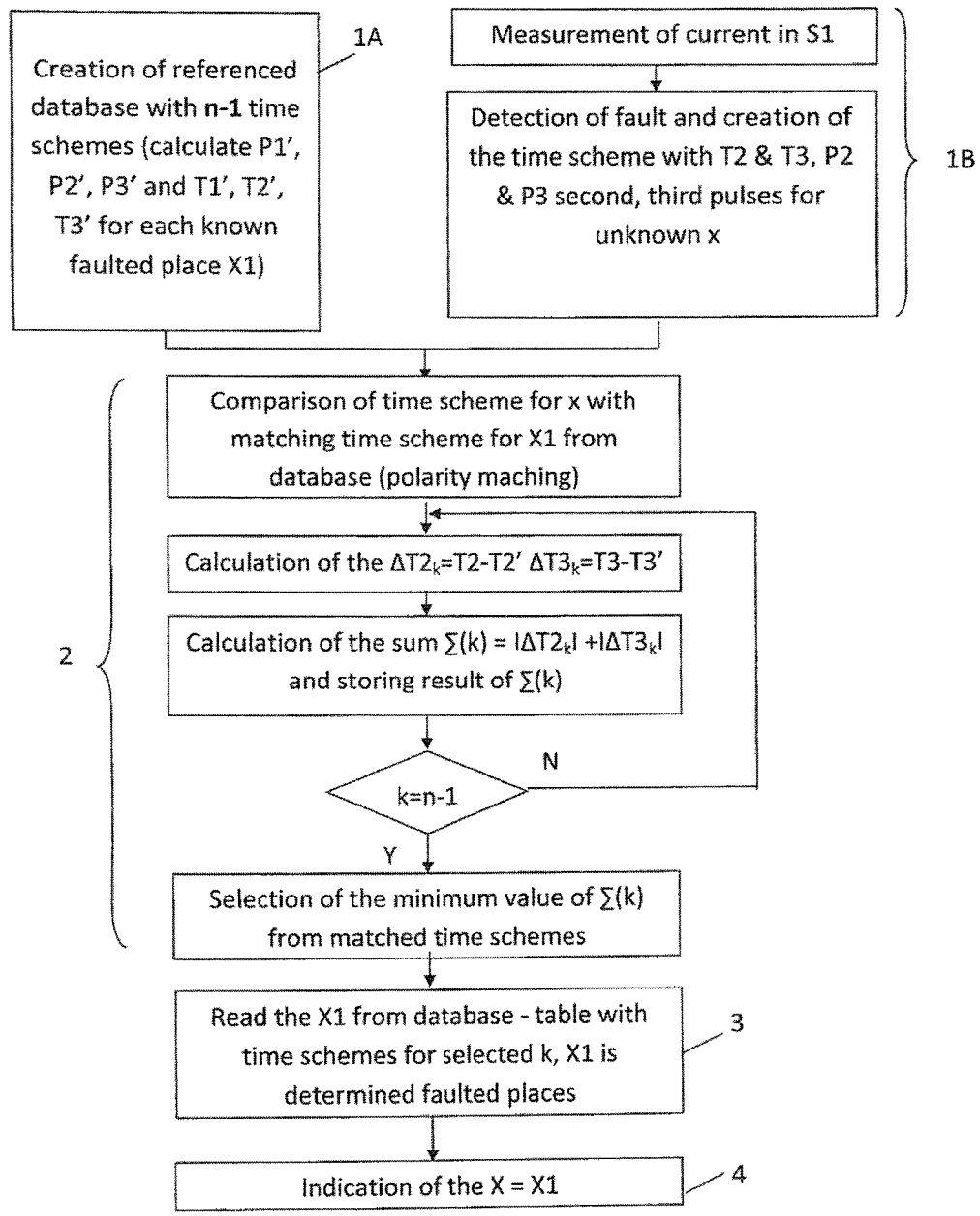
Figure 3:
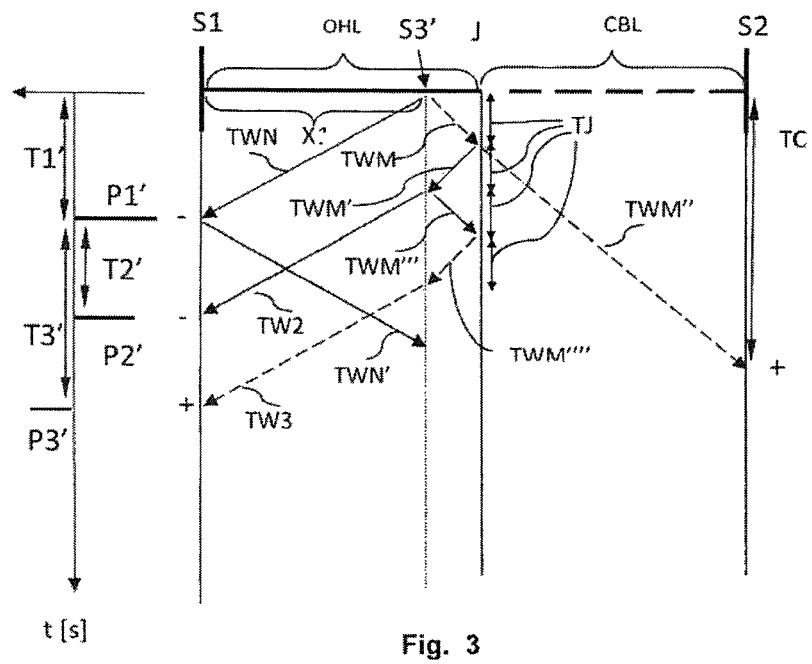
Figure 4:
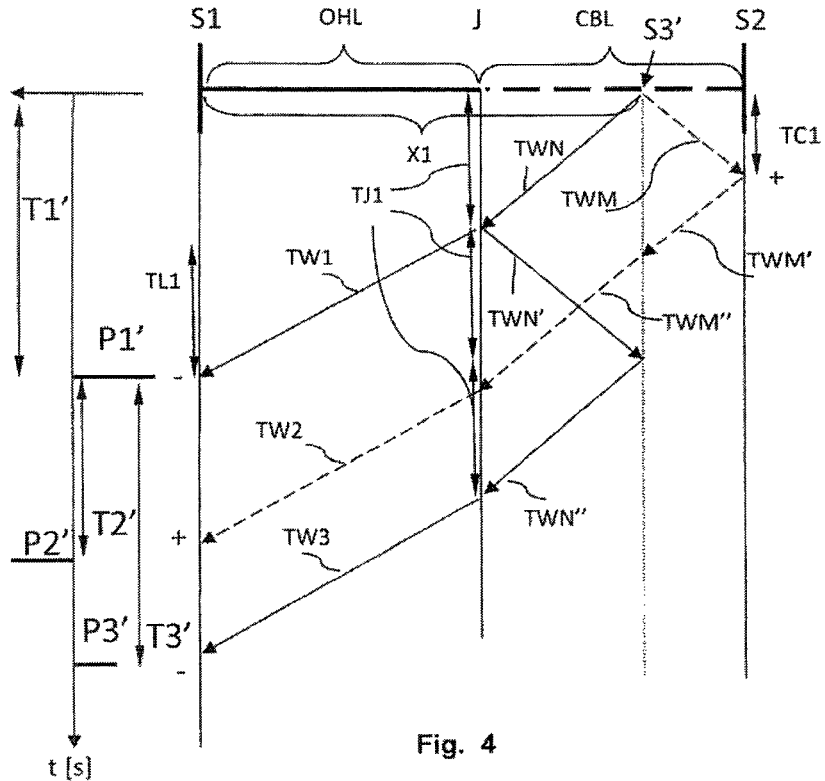
Figure 5:
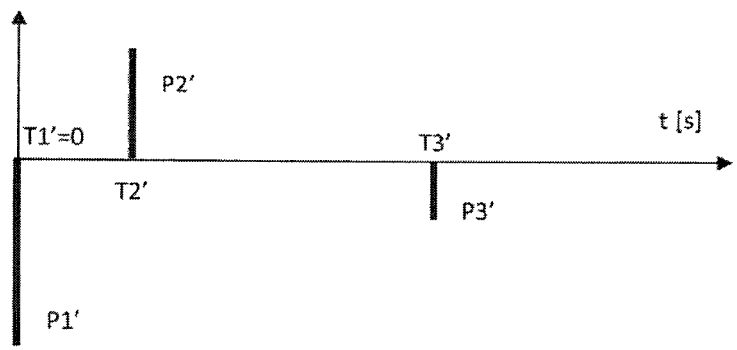
Figure 6:
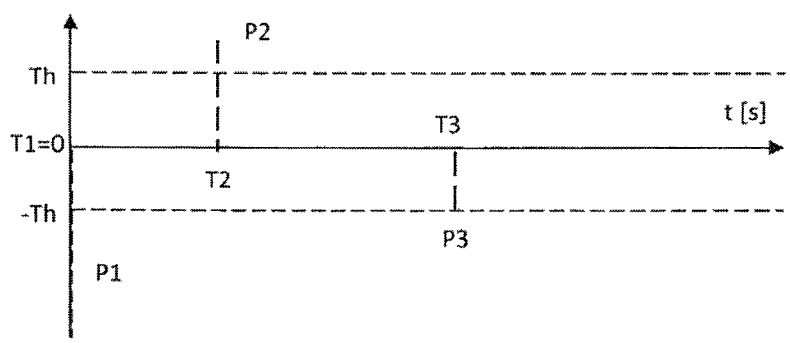
Figure 7:
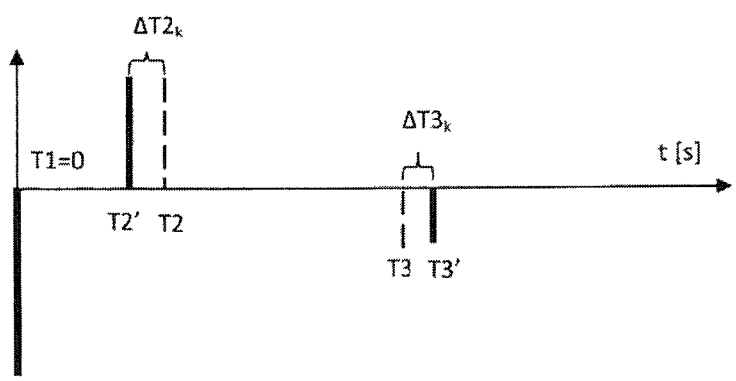

The inventive method is presented in exemplary embodiment on the drawing where:

FIG. 1—depicts the transmission system in which the presented invention is operated, FIG. 2—depicts a set of steps for the realization of the inventive method, FIG. 3—depicts a Bewley lattice diagram for times of arrival of theoretical traveling waves propagated in a faulted point, placed in an overhead part of the transmission line, FIG. 4—depicts a Bewley lattice diagram for times of arrival of theoretical traveling waves propagated in a faulted point, place in a cable part of the transmission line, FIG. 5—depicts a theoretical time scheme for pulses generated for fault at a known place X1 and times of arrival such pulses to the measuring device, FIG. 6—depicts a real time scheme for pulses generated in real faulted place X and times of arrival such pulses to the measuring device, FIG. 7—depicts an example of comparison of times schemes taking from FIG. 5 and FIG. 6.

As shown in. FIG. 1 the system comprises a HVDC transmission line 1 having an overhead line section OHL and a cable line section CBL. The junction point between the two types of lines is indicated as J. The total length of the transmission line 1 is indicated as TL. The line 1 has a terminal A having a measurement point S1 and a terminal B having a measurement point S2. Between the points S1 and S2 the place of a fault through fault resistance RF is shown as point S3 which can be placed anywhere in the line sections OHL or CBL. In the terminal A, a fault locator 2 is placed having an electrical connection with the measurement point S1. The fault locator is a computer device equipped with standard means e.g. processor, RAM, ROM, power supply etc., means for measuring and processing variable parameters of the line 1, not presented on the drawing, and means for detecting the fault in the form of a detection module 3. The detection module 3 is connected with an operational module 4 for generating and storing a special time scheme for data receive from module 3, concerning the time of arrival traveling waves from faulty point S3. The fault locator 2 is also equipped with a data-based creation module 5 in which a reference database is automatically created on the base of known constant and variable data of the transmission line 1 and on a base that the fault is placed in a known theoretical distance, which data is gathered in a special table, that will be explained later. Database creation module 5 is adapted for receiving the permanent data from user in terminal A and variable data from the point S3 by connection 6. Both modules: the operational module 4 and the data-based creation module 5 have their outputs to the input of a fault location module 7 for determination the fault location by comparison real data stored in module 4 with the theoretical data calculated and stored in module 5. The output of the module 7 is connected with a device 8 for presenting the result of fault location in transmission line or a device for triggering an alarm if it is needed, having a form of the know devices used in such situation (display, phone, warning light or sound, etc.). The fault locator 2 is placed in the terminal A but it could be situated in terminal B and in such situation the measuring point is S2 instead of the point S1. The method concerns only one single end fault location for the HVDC line.

The method according to the invention comprises the following steps.

Step 1A

In step 1A a special reference database is created in a module 5 of the fault locator 2 as a time scheme for a fault location in a known theoretical distance X1. Assuming the creation of theoretical traveling wave pulses P1', P2', P3' in a theoretical faulted point S3', theoretical arrival times T1', T2', T3' of these pulses to the measuring point S1 is calculated for a known fault distance X1, taking into account a polarity (+ or −) of wave pulses (FIG. 5). The known distance of fault X1 is given by a user as equal intervals for the HVDC line having a total length TL. The transmission line 1 is divided for many equal intervals k=1 . . . n−1, having an initial point S1 and many variable theoretical fault points S3' in the distance X1, presented in meter: for example 100 m, 200 m, 300 m, 5000 m, . . . 59900 m, etc. A computer program, which is implemented in the processor of the fault locator 2 creates a table 1 for k(1), k(2) . . . k(n−1), where k is an ordinal number of known interval and indicates theoretical faulted point in line in the known distance X1, n is a natural number. For creation the table 1, having a known distance X1, using a Bewley lattice diagrams for fault in overhead line section and fault in a cable line section (FIGS. 3 and 4) a theoretical time schemes (left side of FIGS. 3 and 4) are created. All theoretical k time schemes for each known distance X1 are gathered in an exemplary table 1.

TABLE 1

| K | X1 [m] | P1' | P2' | P3' | T1' [µs] | T2' [µs] | T3' [µs] |
|---|--------|-----|-----|-----|----------|----------|----------|
| 1 | 100 | − | − | − | 0.33 | 0.66 | 1.33 |
| 2 | 200 | − | − | − | 0.66 | 1.33 | 2.66 |
| 3 | 300 | − | − | − | 1 | 2 | 4 |
| . . . | | | | | | | |
| 297 | 29700 | − | − | + | 99 | 2 | 4 |
| 303 | 30300 | − | + | − | 102 | 4 | 8 |
| . . . | | | | | | | |
| 500 | 50000 | − | + | − | 233.33 | 133.33 | 266.66 |
| . . . | | | | | | | |
| n − 1 | 59900 | − | + | + | 299.33 | 1.33 | 2.66 |

In order to better understand the creation of the table 1, the example of calculation of k time scheme for Table 1 is presented below on k=499 for the fault in overhead line section OHL and k=800 for the fault in cable line section CBL. The junction point J is the end of overhead line section OHL or the start point for the cable line section CBL. This example is based on measured current signal at one end of HVDC line. The parameters of the line 1 are known in terminal A or B.

For overhead line section OHL the following parameters are known:

Surge impedance ZL=400 Ω
Propagation velocity of traveling waves VL=300000 [km/s]
Total length of overhead line section OHL=30 km For cable line section CBL the following parameters are known:

Surge impedance for cable line: ZC=50 Ω
Propagation velocity of traveling waves: VC=150000 [km/s]
Total length of cable line CBL=30 km The traveling wave pulses P1', P2', P3' in a theoretical faulted point S3' and theoretical arrival times T1', T2', T3' of such pulses to the measuring point S1 are calculated, using Bewley lattice diagrams, what is explained on FIGS. 3 and 4.

According to drawing presented in FIG. 3 a backward traveling wave TWN of current signal has a negative polarity. In opposite to a forward traveling wave TWM has a positive polarity. After fault ignition in the line OHL in a point S3 that is close to junction J, the both waves TWN and TWM propagate along line with the speed VL in different direction. The wave TWN which reaches the terminal A at the measuring point S1, has the arrival time T1' that is calculated according to equation T1'=X1/VL and the pulse P1' has the negative polarity. Then, the wave TWN is reflected back as TWN' and it is propagated to the fault point S3. Mutually with the propagation of TWN the forward traveling wave TWM reaches the junction point J and has the time TJ, that is calculated according to equation TJ= (OHL−X1)/VL. It has a positive polarity. Then a first part of wave TWM is transmitted through the point J and becomes TWM", still has a positive polarity and is traveled to S2 after time TC equal TC=CBL/VC. A second part of a wave TWM is reflected from the point J and becomes TWM' and is traveling to fault place S3 after time equal to TJ and changes the polarity from positive to negative because of reflection coefficient is equal to (ZC−ZL)/(ZL+ZC) and is negative. When wave TWM' reaches S3 then part of wave TWM' is transmitted through S3' and becomes TW2 with a negative polarity and is traveled to S1 after time T2' equals T2'=2*TJ. Second part of wave TWM' is reflected from point S3' and becomes wave TWM''' and reaches point J again after time TJ. Again wave TWM''' is reflected from point J and becomes TWM'''' and is traveling to fault place S3 after time equal to TJ. When wave TWM'''' reaches S3 then part of wave TWM'''' is transmitted through fault point S3 and becomes wave TW3 which is traveled to S1 at time T3' equals T3'=2*TJ. This situation is for example described in table 1 for k=297 that is related to known fault place X1=29700m (Table 1). The value of T2' is equal 2 μs because second wave P2' is traveling after first wave P1' with time delay equal 2*TJ=2*1 μs. The value of T3' is 4 μs because third wave P3' is traveling after first wave P1' with time delay equal 4*TJ=4*1 μs.

According to drawing presented in FIG. 4 a backward traveling wave TWN of current signal has a negative polarity. In opposite to a forward traveling wave TWM has a positive polarity. After fault ignition in S3' the both waves TWN and TWM propagate along line with the speed VC in different direction. The wave TWN reaches the J point after the time TJ1 that is calculated according to equation TJ1= (X1−OHL)/VC, and has the negative polarity. Then the first part of wave TWN is reflected back as wave TWN', which has negative polarity because of reflection coefficient is equal to (ZL−ZC)/(ZL+ZC) and it is propagated to the fault point S3 which reaches again after time TJ1. The second part of wave TWN is transmitted through point J, becomes wave TW1 and is traveling in line OHL by time TL1=OHL/VL to terminal A from point J. TW1 reaches the point S1 as the pulse P1' with the same polarity as wave TWN at arrival time T1' that is calculated according to equation T1'=TJ1+ TL1. Mutually with the propagation of wave TWN the forward traveling wave TWM is traveled to the terminal B and reaches point S2 with the arrival time TC1 equal to TC1=(OHL+CBL−X1)/VC, and has a positive polarity. Then wave TWM is reflected from point S2 and becomes wave TWM' has positive polarity and is traveled to S3, which reaches after time TC1. Next part of wave TWM' is transmitted through S3 and becomes TWM" and is traveling to point J after time equal to TJ1 from point S3. When wave TWM" reaches point J then part of wave TWM" is transmitted through point J and becomes wave TW2 with positive polarity P2' which is traveling by time TJ1 from point J to S1 and reaches S1 at time T2' equals T2'=2*TC1 after time T1'.

When wave TW1 is traveling to point S1 from point J, the second part of wave TWN' is reflected from point J and becomes wave TWN' and reaches point S3 again after time TJ1. Then part of wave TWN' is reflected from point S3 and becomes TWN" which has negative polarity and is traveling to point J by time TJ1. When wave TWN" reaches point J then part of wave TWN''' is transmitted through point J and becomes wave TW3, which has still negative polarity and is traveling from point J to terminal A by time TL1 and reaches the point S1 at time T3' equals T3'=2*TJ1 after time T1'. This situation is for example described in table 1 for k=500 that is related to known fault place X1=50000 m (Table 1)) The value of T2' is equal 133,33 μs because second wave P2' reaches point S1 after first wave with time delay equal 2*TC1=2*66,66 μs. The value of T3' is 266,66 μs because third wave P3' is traveling after first wave P1' with time delay equal 2*TJ1=2*133,33 μs.

Step 1B

In step 1B first a fault is detected in a known way using HVDC current signals of the transmission line 1 in the point 51. Next a polarity of traveling wave pulses P1, P2, P3 and the time of arrival T1, T2, T3 of the such pulses to the point S1 (FIG. 6) are determined. The pulses P1, P2, P3 are related to a fault in unknown points in the line 1, for example in the point S3. An initial arrival time T1 of the pulse P1 is registered when the value of the measured magnitude of pulse P1 is bigger than the threshold Th, which is depended of the total length of the line and is given by the user. The T1 is a starting point of next pulses P2, P3. Then next pulses P2, P3, are registered and the second arrival time T2, and the third arrival time T3 for these pulses are calculated and stored in a detection module 3. On the base of data presented above, a time scheme with T2, T3 for unknown distance X is created (FIG. 6). From time scheme is clear that P1 and P3 have a negative polarity and P2 has a positive polarity.

Step 2

In this step, time scheme created in step 1B for unknown faulted points in distance X is compared with the all theoretical time schemes, gathered in the table 1. The process of matching a real time scheme with the theoretical time scheme is started. In first step the polarity of second and third pulse P2 and P3 is checking, because the first pulse P1 has always negative polarity. If the polarity of P2 and P3 of time scheme for unknown X is matched with the polarity of P2' and P3' for time scheme from database created in step 1A (FIG. 5 and FIG. 6), then arrival times T2', T3' for this case are taken from the table 1 for calculation together with the real arrival times T2, T3 of pulses P2 and P3 from the time scheme for unknown faulted place created in step 1B. In the table one it is occurs for k equal 500, what means a fault located in CBL section.

Next time differences $\Delta T2_k = T_2 - T_{2'}$ and $\Delta T3_k = T_3 - T_{3'}$ (FIG. 7) are calculated according to the formulas:

$$\Delta T2_k = T_2 - T_{2'} \tag{1}$$

and $$\Delta T3_k = T_3 - T_{3'} \tag{2}$$

And next a sum Σ(k) of absolute values of time differences ΔT2 and ΔT3 is calculated for second and third traveling wave pulses, according to the formula:

$$\Sigma(k) = |\Delta T2_k| + |\Delta T3_k| \quad (3)$$

After that the result of the sum Σ(k) is stored in the module 7, and process of comparison starts again for next k from table 1 and is calculating until k is equal to n−1. For the all time schemes from database matched with time scheme for unknown X1 the sum of Σ(k) is calculated and stored. Then the minimum value of the stored sum of Σ(k) is selected in a known way. Then the only one related number k, having a minimum value of Σ(k) is indicated.

Step 3

In step 4 a known fault location distance X1 is determined with one time schemes created in step 1A and selected in step 2 for indicated k. The k indicated in Step 2 is connected with related value of X1 that is stored in table 1.

Step 4

The unknown fault location distance X is determined from the best matching time scheme for the minimum value of the sum Σ(k) and the unknown distance X is equal to value X1, which value is indicated an unknown fault location and triggering the alarm.

What is claimed is:

1. A method of determining a fault location in mixed transmission lines where a mixed transmission line comprises an overhead line, a cable line or any combination thereof, wherein a junction point connects the overhead line to the cable line, where each line has different surge impedances and different wave propagation velocities, wherein additional wave reflections are generated at the junction point of the overhead line and the cable line, where the method improves the accuracy from one end measurement of the mixed transmission line, the method comprising:
   providing a mixed high voltage direct current (HVDC) transmission line including an overhead line section and a cable line section connected to one another at a junction point, wherein each section has different surge impedances and different wave propagation velocities, and wherein said junction point generates additional wave propagation velocities, said mixed HVDC transmission line having a terminal with a measurement point at each end,
   placing a fault locator at one of said measurement points, wherein said fault locator comprises:
      a detection module connected to one of said measurement points to detect a fault having a fault resistance anywhere in said overhead and cable line sections and generate fault characteristic data;
      an operational module connected to and receiving said fault characteristic data from said detection module for generating and storing a time scheme of received traveling waves from said fault;
      a creation module connected to said measurement point comprising a reference database of known and variable data of said mixed HVDC transmission line; and
      a fault location module which receives said time scheme for comparison to said known and variable data stored in said reference database;
   creating said reference database for use in said creation module by generating theoretical time schemes for at least first, second and third theoretical traveling wave pulses P1', P2', P3' generated in theoretical faulted points (S3') for theoretical distances (X1) established by a user for known mixed HVDC transmission line parameters which includes said junction point and arrival times T1', T2', T3' wherein such pulses are calculated with respect to said measurement point (S1),
   detecting the presence of traveling wave pulses from an unknown real fault point (S3) of a faulted mixed HVDC transmission line for an unknown distance (X) through measuring actual traveling wave pulses P1, P2, P3 in one end of the faulted mixed HVDC transmission line and calculation of arrival times of first T1, second T2 and third T3 of traveling wave pulses P1, P2, P3 in said detection module for unknown distance (X) for the faulted mixed HVDC transmission line, when a magnitude of the first pulse P1 has a value bigger than a threshold (Th) given by the user then T1 is equal 0, and creating a real time scheme with T1, T2, T3 of pulses P1, P2, P3 measured at said measurement point S1,
   comparing in said fault location module a real time scheme of traveling wave pulses P1, P2, P3 for unknown faulted point with all theoretical time scheme of pulses P1', P2', P3' for known theoretical faulted points (S3') and matching by polarity checking of real time scheme for unknown point with all theoretical time schemes,
   indicating the known distance (X1) by selecting the best matching theoretical time scheme for known distance with the real time scheme for unknown distance (X), and
   indicating the unknown distance (X) as a value equal to the known distance (X1) which determines the location of faulted point in said faulted mixed HVDC transmission line with said junction point without using a positioned fault locator between the measurement points.

2. A method according to claim 1, characterized in that theoretical time schemes for first, second and third theoretical faulted pulses P1', P2', P3' generated in theoretical faulted points are based on Bewley lattice diagrams for such pulses and theoretical arrival times T1', T2', T3' calculated for theoretical known distances (X1) given by user, are taken for creation theoretical time schemes.

3. A method according to claim 1, characterized in that the process of matching real time scheme for unknown faulted point with theoretical time schemes is based on calculating a difference ($\Delta T2_k$) between the real arrival times T2 and theoretical arrival time T2' for traveling wave of second pulses P2 and P2', and a difference ($\Delta T3_k$) between the real arrival times T3 and theoretical arrival time T3' for traveling wave of third pulses P3 and P3'.

4. A method according to claim 3, characterized in that a sum (Σ(k)) of absolute values of time differences (ΔT2) and (ΔT3) is calculated, where (k) is an order number in the reference database.

5. A method according to claim 4, characterized in that the unknown distance (X) is determined by selection of a minimum value of an sum of absolute time differences (Σ(k)).

6. A method according to claim 1, characterized in that after the determination the unknown distance (X) an alarm is triggered for said faulted point.

* * * * *